United States Patent
Bae et al.

(10) Patent No.: US 6,548,851 B2
(45) Date of Patent: Apr. 15, 2003

(54) SEMICONDUCTOR MEMORY DEVICE WITH INCREASED LEVEL OF INTEGRATION

(75) Inventors: Ki-Soon Bae, Seoul (KR); Hoon-Chi Lee, Yongin-shi (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 49 days.

(21) Appl. No.: 09/755,086

(22) Filed: Jan. 8, 2001

(65) Prior Publication Data

US 2001/0009285 A1 Jul. 26, 2001

(30) Foreign Application Priority Data

Jan. 26, 2000 (KR) .......................................... 2000-3625

(51) Int. Cl.[7] ..................... H01L 27/108; H01L 29/76; H01L 29/00
(52) U.S. Cl. ..................... 257/306; 257/296; 257/533
(58) Field of Search ..................... 257/296, 306, 257/533

(56) References Cited

U.S. PATENT DOCUMENTS 6,172,389 B1 * 1/2001 Sakoh ........................ 257/296

FOREIGN PATENT DOCUMENTS

JP          8-274274     * 10/1996   .................. 257/296

* cited by examiner

*Primary Examiner*—Steven Loke
(74) *Attorney, Agent, or Firm*—Lee & Sterba, P.C.

(57) ABSTRACT

A semiconductor memory device and a method of manufacturing same, wherein landing pads are formed to contact source/drain regions of an access transistor in a memory cell array area and a first resistor device is formed in the peripheral circuit area, by depositing a first conductive layer on a semiconductor substrate having an access transistor formed thereon and patterning the first conductive layer. An interlayer insulation layer is deposited on the resultant structure, and a lower electrode and a dielectric layer having a high dielectric constant of a capacitor are formed to contact the source/drain region of the access transistor. By depositing a second conductive layer on the resultant structure having the dielectric layer and patterning the dielectric layer, a capacitor upper electrode is formed in the memory cell array area and a second resistor device is formed in the peripheral circuit area.

14 Claims, 4 Drawing Sheets though the gate of the access transistor by etching the third interlayer insulation layer, the silicon nitride layer, and the second interlayer insulation layer. Next, a polysilicon layer 46a for a lower electrode of the capacitor is formed by depositing a polysilicon layer on the resultant structure, filling the opening with the polysilicon layer, and etching the polysilicon layer. Preferably, the polysilicon layer is deposited by a CVD (Chemical Vapor Deposition) method using silane (SiH₄) or disilane (Si₂H₆) gas as a silicon source gas and is doped with phosphorus (P) as an impurity.

Referring to FIG. 3D, a hemispherical grained silicon (HSG) layer 48 is formed on the surface of the polysilicon layer 46a by depositing and annealing the silicon source gas. Therefore, the surface area of the lower electrode of the capacitor is increased, resulting in an increase of the charge storage capacity of the capacitor. Preferably, the silicon source gas is silane or disilane.

Referring to FIG. 3E, a dielectric layer 50 and a third polysilicon layer 52 are formed by sequentially depositing a dielectric material having a high dielectric constant such as an ONO film and a polysilicon on the resultant structure. Next, a first resistor device 52a having a length C and a third polysilicon layer 52b for an upper electrode of the capacitor are formed by patterning the third polysilicon layer 52 by photolithography. A portion A of a dielectric material 50a remains under the resistor device 52a, and the other portion of the dielectric layer 50b remains under the upper electrode 52b. Referring to FIG. 3F, a planarized fourth interlayer insulation layer 54 is formed by depositing an oxide film on the resultant structure. A second resistor device 42b having a length D is formed in the peripheral circuit area by the second polysilicon layer 42. Meanwhile, a first resistor device 52a having a length C is formed in the peripheral circuit area by the third polysilicon layer 52. Accordingly, the length of the resistor device in the peripheral circuit area is C+D. The first resistor device 52a can be designed in a first column of the peripheral circuit area, and the second resistor device 42b can be designed in a second column of the peripheral circuit area.

Preferably, the distance between the first resistor device 52a and the second resistor device 42b in a horizontal direction should be as great as possible to reduce parasitic capacitance between the first resistor device 52a and the second resistor device 42b. Although a contact for applying a voltage to the resistor devices is not shown in FIG. 3F, a general method known in the art can be used to form the contact.

According to an embodiment of the present invention, a resistor device is formed in a peripheral circuit area when a landing pad for contacting the source/drain region of an access transistor is formed. Furthermore, another resistor device is formed in the peripheral circuit area when a lower electrode of a capacitor is formed in a memory cell array area. Therefore, two or more resistor devices can be formed in the peripheral circuit area, and, accordingly, the length of the resistor devices can be minimized to satisfy the resistance required for a circuit operation. That is, the area occupied by the resistor device is reduced, thereby increasing the level of integration.

According to an embodiment of the present invention, the area occupied by the resistor device is reduced to ensure subsequent process margin because the length of the resistor device is minimized. Furthermore, the present invention can ensure high resistance required for circuit operation with a minimum occupied area, and thereby increases the level of integration.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory device, comprising:

a memory cell array area; and a peripheral circuit area, wherein a first resistor device is formed in the peripheral circuit area when a landing pad is formed to contact an impurity diffusion region of an access transistor in the memory cell array area, and a second resistor device is formed in the peripheral circuit area when a lower electrode of a capacitor contacting the impurity diffusion region is formed in the memory cell array area.

2. The semiconductor memory device as claimed in claim 1, wherein the landing pad, the lower electrode of the capacitor, the first resistor device and the second resistor device comprise polysilicon.

3. The semiconductor memory device as claimed in claim 1, wherein the first and second resistor devices are spaced by a predetermined distance in a horizontal direction.

4. A method of manufacturing a semiconductor memory device, comprising:

forming landing pads to contact a source/drain region of an access transistor in a memory cell array area and a first resistor device in a peripheral circuit area by depositing a first conductive layer on a semiconductor substrate having the access transistor formed thereon and patterning the first conductive layer;

forming an interlayer insulation layer on a resultant structure;

forming a lower electrode and a dielectric layer having a high dielectric constant of a capacitor to contact the source/drain region of the access transistor; and forming a capacitor upper electrode in the memory cell array area and a second resistor device in the peripheral circuit area by depositing a second conductive layer on a resultant structure having the dielectric layer and patterning the dielectric layer.

5. The method as claimed in claim 4, wherein the first and second conductive layers are polysilicon layers.

6. The method as claimed in claim 4, wherein the first and second resistor devices are spaced by a predetermined distance in a horizontal direction.

* * * * * in the peripheral circuit area when a capacitor upper electrode is formed in the memory cell array area.

These and other features of the present invention will be readily apparent to those skilled in the art upon review of the detailed description of the preferred embodiments that follows.

BRIEF DESCRIPTION OF THE DRAWINGS

The above and other features and advantages of the present invention will become more apparent from the following detailed description when taken in conjunction with the accompanying drawings in which.

DETAILED DESCRIPTION OF THE PREFERRED EMBODIMENTS

A preferred embodiment of the present invention will be described hereinbelow with reference to the accompanying drawings. In the following description, wellknown functions or constructions are not described in detail since they would obscure the invention in unnecessary detail.

FIGS. 2A to 2D sequentially illustrate sectional views of a method of manufacturing a DRAM device having a memory cell array area and a peripheral circuit area according to a preferred embodiment of the present invention.

Figure 2A:
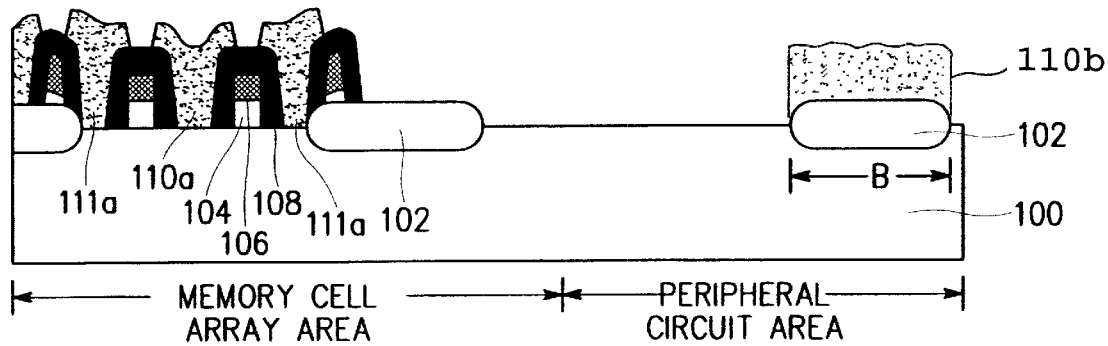
FIGS. 2A to 2D sequentially illustrate sectional views of a method of manufacturing a DRAM device having a memory cell array area and a peripheral circuit area in accordance with a preferred embodiment of the present invention.

Referring now to FIG. 2A, a field oxide film 102 is formed on a semiconductor substrate 100 by a general device isolation process to define an active region and a field region. A gate insulation layer (not shown), a polysilicon layer 104, and a metal silicide layer 106 are sequentially formed on a memory cell array area of the semiconductor substrate 100. A gate area is formed by forming a spacer insulation layer 108 that covers the gate insulation layer, the polysilicon layer 104, and the metal silicide layer 106. Then source/drain regions are formed at both sides of the gate area by general ion implantation, thereby completing an access transistor.

Subsequently, a conductive layer is deposited to a thickness of about 500 to 5000 Å, preferably about 2000 Å, on the semiconductor substrate 100 having the access transistor formed thereon. Landing pads 110a and 111a are formed in the memory cell array area by photolithography. Through the landing pad 110a, a bit line and a capacitor lower electrode that will be formed later are electrically connected to the drain and source region of the access transistor, respectively.

While the conductive layer is used as a landing pad in the memory cell array area only in the conventional technology, the conductive layer partially remains in the peripheral circuit area to act as a first resistor device 110b of length B in the present invention. Preferably, the first resistor device 110b is formed on the field oxide film 102 to prevent damage to the active region during etching. Forming the first resistor device 110b in the peripheral circuit area using the conductive layer for the landing pad ensures high resistance necessary for circuit operation, as compared to a conventional DRAM device known in the prior art.

Figure 2B:
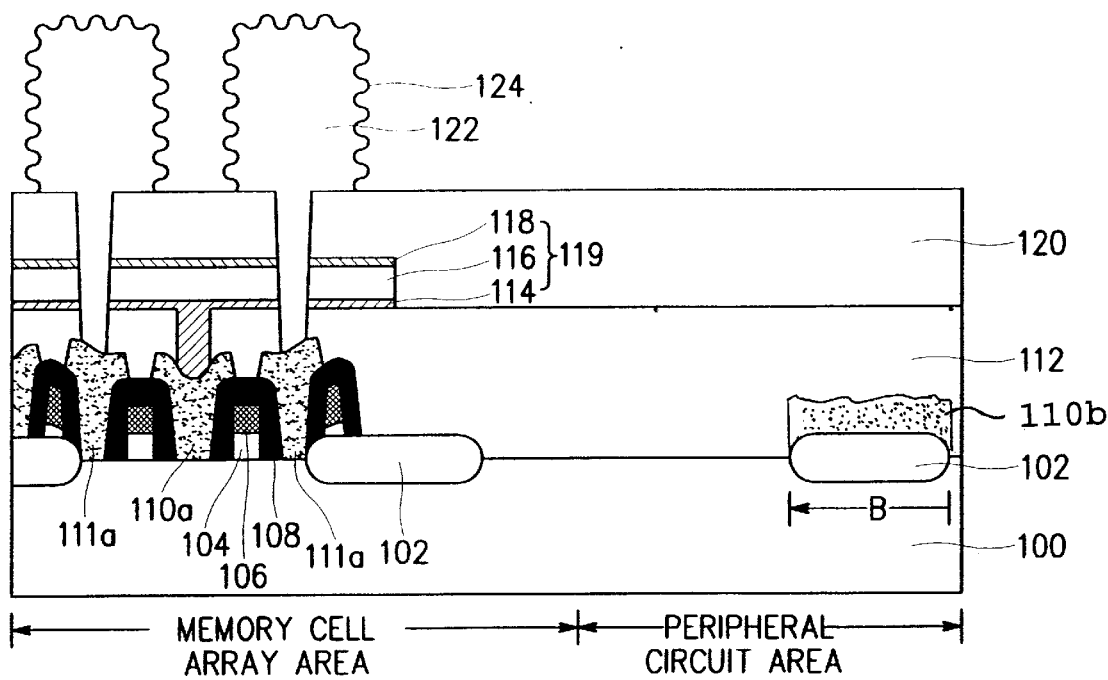

Referring to FIG. 2B, a first interlayer insulation layer 112 is formed by depositing a PSG (Phosphorus Silicon Glass), BPSG (Boron Phosphorus Silicon Glass), or USG (Undoped Silicon Glass) on the overall surface of the semiconductor substrate 100 having the first resistor device 110b formed thereon by CVD (Chemical Vapor Deposition). After an opening is formed to expose the landing pad 110a in contact with the drain region of the access transistor, a bit line 119 is formed by sequentially forming a polysilicon layer 114, a tungsten silicide layer 116, and an anti-reflection layer 118. Then, a second interlayer insulation layer 120 is formed by depositing a PSG, BPSG, or USG on the resultant structure having the bit line 119 by CVD and an opening is formed by photolithography to expose the landing pad 111a in contact with the source region of the access transistor. Thereafter, a storage electrode is formed as a lower electrode of a capacitor by depositing a doped polysilicon on the resultant structure having the opening and patterning the polysilicon. Preferably, an HSG (Hemi-Spherical grain) storage electrode 122 is formed with the doped polysilicon pattern in an HSG storage electrode manufacturing method (for further details see "Extended Abstracts of the International Conference on Solid State Device and Materials", pp. 422–24, or U.S. Pat. No. 5,385,863).

Next, a dielectric layer 124 is formed by depositing a material layer having a high dielectric constant, like an ONO layer, on the storage electrode 122.

Figure 2C:
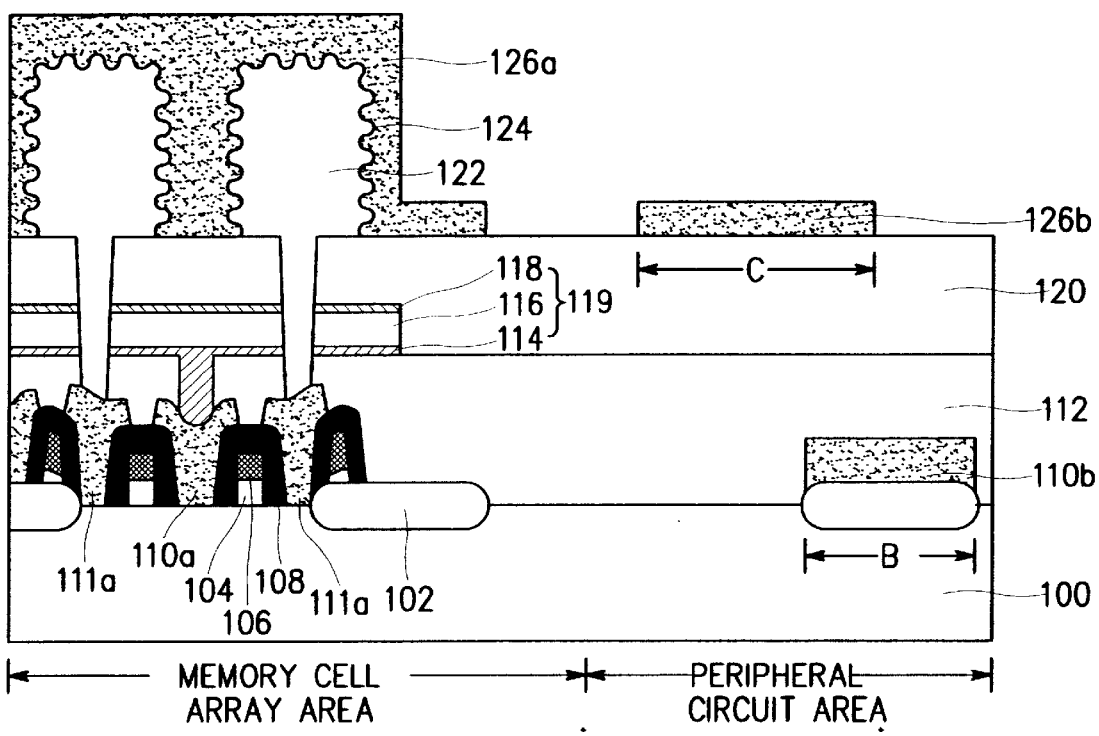

Referring to FIG. 2C, a polysilicon layer is formed to a thickness of about 500–5000 Å, preferably about 2000 Å on the resultant structure including the dielectric layer 124. A plate electrode 126a is formed to act as the upper electrode of the capacitor by subjecting the polysilicon layer to photolithography.

Using the polysilicon layer for the plate electrode 126a, a second resistor device 126b of length C is formed in the peripheral circuit area. It is preferable to form the first and second resistor devices 110b and 126b apart from each other and separated by a predetermined distance in a horizontal direction because there should be a connection between the resistor devices 110b and 126b.

Figure 1:
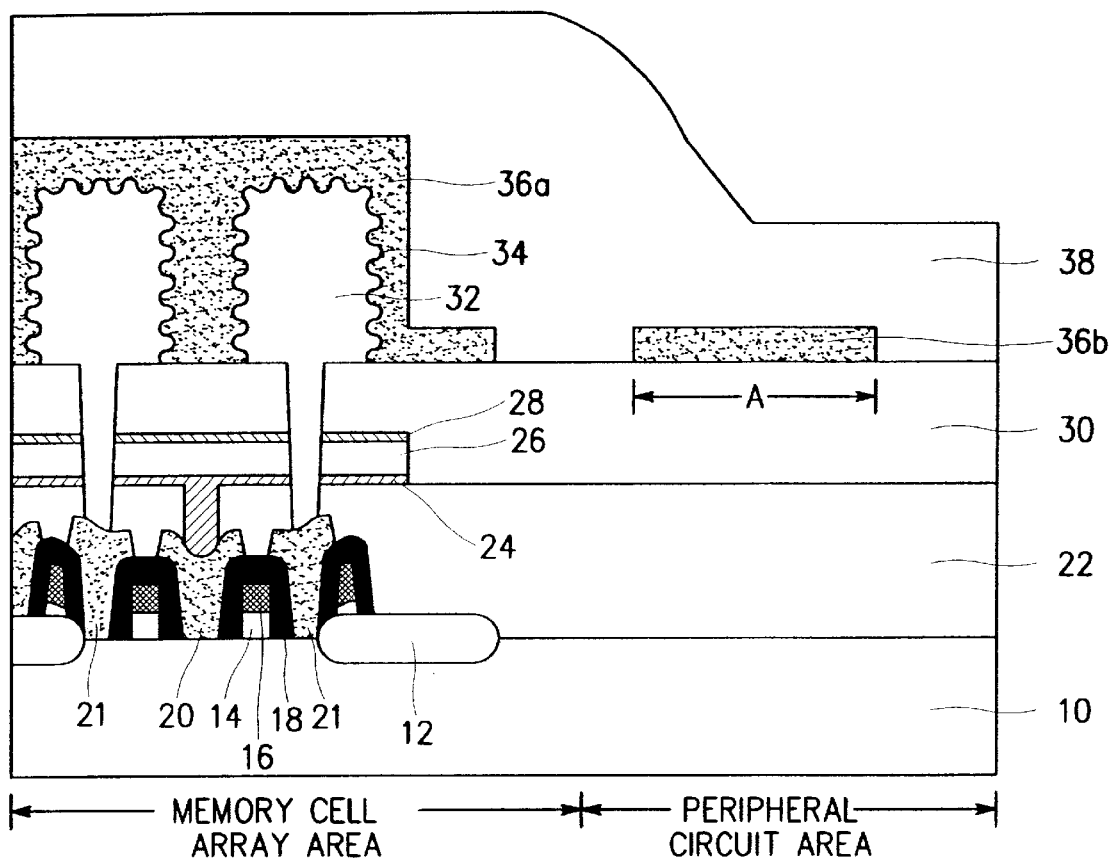
FIG. 1 illustrates a sectional view of a cell array area and a peripheral circuit area in a conventional DRAM device known in the prior art.

Since the first resistor device 110b was formed in the peripheral circuit area when the landing pads 110a and 111a were formed, the same or a higher resistance can be achieved even if the second resistor device 126b is formed shorter than a conventional resistor device 36b (see FIG. 1). In addition, the integration level of semiconductor devices decreases in the conventional technology because the resistor device is made longer when necessary to achieve high resistance necessary for circuit operation. On the contrary, in the present invention, formation of two resistor devices ensures the required high resistance and increases the level of integration of the semiconductor device.

If the length of the conventional resistor device 36b, A, is equal to the length of the second resistor device 126b of the present invention, C, the first resistor device 110b provides a higher resistance than the conventional resistor device 36b. Even if the length of the second resistor device 126b, C, is smaller than the length of the conventional resistor device 36b, A, resistance as much as the length decrement of the second resistor device 126b can be compensated for through the first resistor device 110b. Therefore, the present invention is favorable for high integration of semiconductors.

Figure 2D:
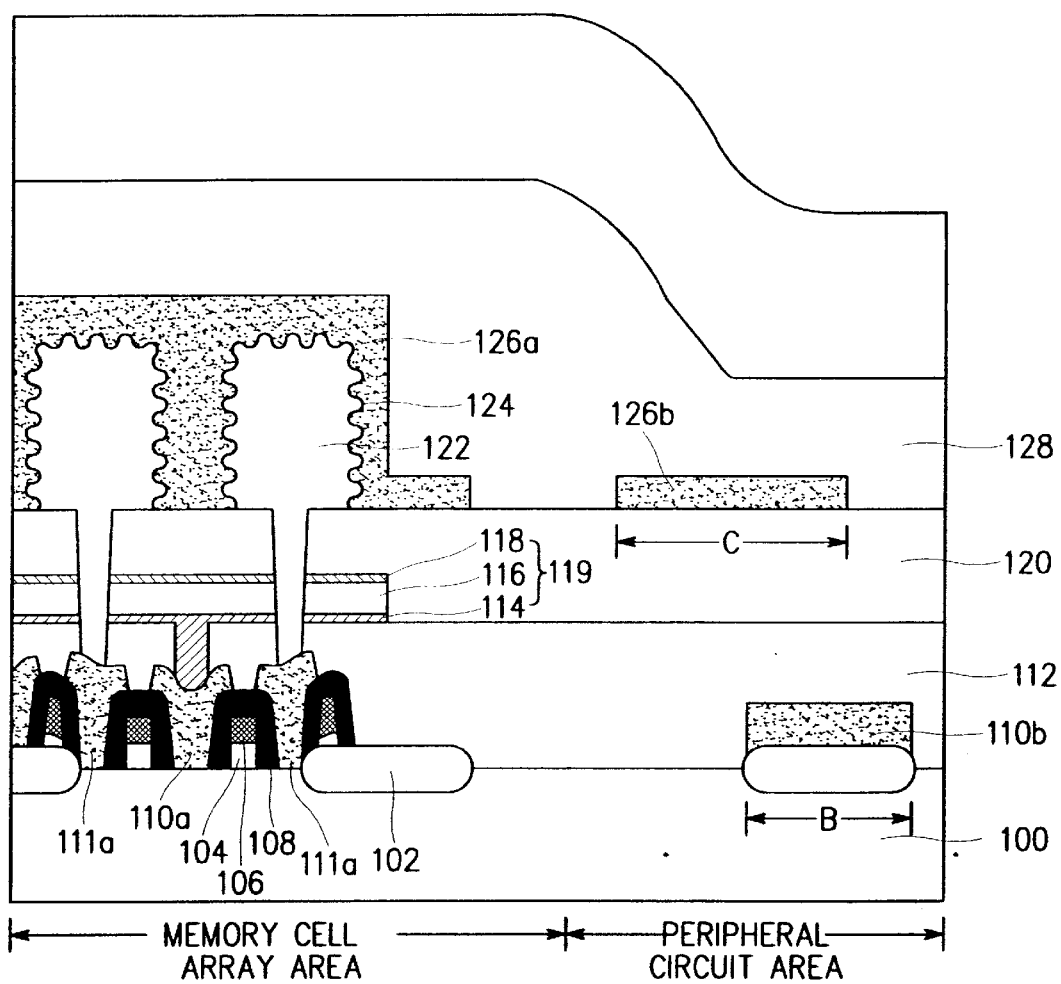

Referring to FIG. 2D, a third interlayer insulation layer 128 is formed by depositing a PSG, BPSG, or USG on the overall surface of the resultant structure including the first and second resistor devices 110b and 126b.

In accordance with an alternate embodiment of the present invention as described above, a first resistor device is formed in a peripheral circuit area using a conductive layer for forming a landing pad in a memory cell array area and a second resistor device is formed in the peripheral circuit area using a conductive layer for forming an upper electrode of a capacitor. By controlling the length of each of the two resistor devices, high resistance necessary for circuit operation is obtained and chip area is minimized, thereby contributing to high integration of a semiconductor device. Furthermore, a process margin is ensured in a subsequent step.

While the invention has been shown and described with reference to certain preferred embodiments thereof, it will be understood by those skilled in the art that various changes or modifications in form and details may be made without departing from the spirit and scope of the invention as claimed.

What is claimed is:

1. A semiconductor memory device having a memory cell array area and a peripheral circuit area, comprising:
   a first resistor device formed in the peripheral circuit area when a landing pad is formed to contact an impurity diffusion region of an access transistor in the memory cell array area;
   a first interlevel insulation layer formed on the overall surface of the semiconductor substrate having the first resistor device formed thereon;
   a bit line formed in the memory cell array region on the first interlevel insulation layer;
   a second interlevel insulation layer formed on the overall surface of the semiconductor substrate having the bit line formed thereon;
   a lower electrode formed in the memory cell array area in contact with the landing pad; and
   a second resistor device formed on a part of the second interlevel insulation layer in the peripheral circuit area when a capacitor upper electrode is formed in the memory cell array area.

2. The semiconductor memory device as claimed in claim 1, wherein the first and second resistor devices are spaced by a predetermined distance in a horizontal direction.

3. The semiconductor memory device as claimed in claim 1, wherein the first resistor device is formed on a field oxide film in the peripheral circuit region.

4. The semiconductor memory device as claimed in claim 1, wherein the lower electrode is formed of doped polysilicon.

5. The semiconductor memory device as claimed in claim 4, wherein the lower electrode is an hemi-spherical grain storage electrode.

6. The semiconductor memory device as claimed in claim 1, wherein the landing pad and the first resistor device are formed of polysilicon.

7. The semiconductor memory device as claimed in claim 1, wherein the upper electrode and the second resistor device are formed of polysilicon.

8. The semiconductor memory device as claimed in claim 1, wherein the bit line is comprised of:
   a polysilicon layer;
   a tungsten suicide layer; and
   an anti-reflection layer.

9. The semiconductor memory device as claimed in claim 1, wherein the access transistor is comprised of:
   a field oxide film on a semiconductor substrate to define an active region and a field region;
   a gate insulation layer in the memory cell array area;
   a polysilicon layer on the gate insulation layer;
   a metal silicide layer on the polysilicon layer; and
   a spacer insulation layer that covers the gate insulation layer, the polysilicon layer, and the metal silicide layer.

10. The semiconductor memory device as claimed in claim 1, wherein the first interleved insulation layer is one of the group consisting of phosphorus silicon glass, boron phosphorus silicon glass and undoped silicon glass.

11. The semiconductor memory device as claimed in claim 1, wherein the second interlevel insulation layer is one of the group consisting of phosphorus silicon glass, boron phosphorus silicon glass and undoped silicon glass.

12. The semiconductor memory device as claimed in claim 1, wherein the first and second resistor devices are about 500–5000 Å thick.

13. The semiconductor memory device as claimed in claim 12, wherein the first and second resistor devices are about 2000 Å thick.

14. A semiconductor memory device on a semiconductor substrate having a memory cell array area and a peripheral circuit area, comprising:
   landing pads formed of a conductive material contacting source and drain regions of an access transistor in the memory cell array area;
   a first resistor device on the semiconductor substrate in the peripheral circuit area formed of a same material as the landing pads;
   a first interlayer insulation layer having openings to expose the landing pads formed on the overall surface of the semiconductor substrate having the landing pads and the first resistor device;
   a bit line contacting the landing pad that is in contact with the drain region of the access transistor, the bit line having an opening to expose the landing pad that is in contact with the source region of the access transistor, and formed on the first interlayer insulation layer in the memory cell array area;
   a second interlayer insulation layer having an opening to expose the landing pad that is in contact with the source region of the access transistor formed on the bit line and first interlayer insulation layer;
   a storage electrode as a lower electrode of a capacitor contacting the landing pad that is in contact with the source region of the access transistor and a part of the second interlayer insulation layer surrounding the opening therein;
   a dielectric layer on the storage electrode;
   a plate electrode as an upper electrode of the capacitor on said dielectric layer in the memory cell array area, including exposed portions of the second interlayer insulation layer in the memory cell array area;
   a second resistor device on a part of the second interlayer insulation layer in the peripheral circuit area formed of a same material as the plate electrode; and
   a third interlayer insulation layer on the overall surface of the semiconductor substrate having the capacitor, access transistor, bit line, and first and second resistor devices.

* * * * *